United States Patent
Sudo

(10) Patent No.: US 10,957,390 B2
(45) Date of Patent: Mar. 23, 2021

(54) SEMICONDUCTOR DEVICE

(71) Applicant: Winbond Electronics Corp., Taichung (TW)

(72) Inventor: Naoaki Sudo, Yokohama (JP)

(73) Assignee: WINBOND ELECTRONICS CORP., Taichung (TW)

(*) Notice: Subject to any disclaimer, the term of this patent is extended or adjusted under 35 U.S.C. 154(b) by 0 days.

(21) Appl. No.: 15/930,046

(22) Filed: May 12, 2020

(65) Prior Publication Data

US 2020/0365206 A1    Nov. 19, 2020

(30) Foreign Application Priority Data

May 13, 2019   (JP) ............... JP2019-090622

(51) Int. Cl.
*G11C 5/14*     (2006.01)
*G11C 14/00*    (2006.01)
*G11C 16/30*    (2006.01)

(52) U.S. Cl.
CPC ........... *G11C 14/0063* (2013.01); *G11C 5/14* (2013.01); *G11C 16/30* (2013.01)

(58) Field of Classification Search
CPC ........ G11C 14/0063; G11C 5/14; G11C 16/30
See application file for complete search history.

(56) References Cited

U.S. PATENT DOCUMENTS

| 2007/0297235 A1* | 12/2007 | Ballweber | G11C 16/10 365/185.22 |
| 2008/0031070 A1* | 2/2008 | Shen | G11C 5/14 365/226 |
| 2016/0148674 A1 | 5/2016 | Louie et al. | |
| 2019/0392918 A1* | 12/2019 | Cariello | G11C 29/028 |
| 2020/0365206 A1* | 11/2020 | Sudo | G11C 5/14 |

FOREIGN PATENT DOCUMENTS

| CN | 1479313 A | 3/2004 |
| JP | 6494139 B1 | 4/2019 |
| TW | M473593 U | 3/2014 |

* cited by examiner

*Primary Examiner* — Khamdan N. Alrobaie
(74) *Attorney, Agent, or Firm* — Birch, Stewart, Kolasch & Birch, LLP

(57) ABSTRACT

A semiconductor device 50 of the invention includes a supply voltage VCC, a plurality of registers 14, a PMOS transistor P, an AND gate 12, and a determination circuit 16. The registers 14 include a first register and a second register. The first register can keep data, and the second register can keep a check bit. The PMOS transistor P and the AND gate 12 are both connected between the supply voltage VCC and the registers 14, and both control the supply from the supply voltage VCC to the registers 14. The determination circuit 16 determines whether the check bit kept in the second register is correct or not in a DPD (deep-power-down) mode. An operating margin of the second register is worse than that of the first register. While the determination circuit 16 determines that the check bit kept in the second register is incorrect, the PMOS transistor P provides the supply voltage VCC to the registers 14.

10 Claims, 4 Drawing Sheets

SEMICONDUCTOR DEVICE

CROSS REFERENCE TO RELATED APPLICATIONS

This Application claims priority of Japanese Patent Application No. 2019-090622, filed on May 13, 2019, the entirety of which is incorporated by reference herein.

BACKGROUND

Field of the Invention

The present invention relates to a semiconductor device such as a flash memory, and in particular, to the operation of a power-down mode.

Description of the Related Art

NAND-type flash memory uses a fuse cell in order to store voltage settings for reading, programming, erasing, etc., or to store setting information such as user options. The setting information may be read from the fuse cell during a power-up operation (i.e. the power is turned on), and is loaded to the internal register (Patent Document 1).

Prior Technical Document

Patent Document

[Patent Document 1] JP 6494139 B1

BRIEF SUMMARY

Problem to Be Solved by the Invention

There are two states of a flash memory: an active state and a standby state. The active state responds to a command from a user for reading, programming, and erasing, etc. A command from a user can be received while in the standby state. In the standby state, the operation of the internal circuit is limited so that power consumption is below a predetermined value; however, when the user inputs a command, it must respond to the command immediately. Therefore, although it is called the "standby state", an off-leak current will be generated in the volatile circuit such as a register. In response to the decreased power supply voltage, the power-down detection circuit must be operated, resulting in a certain amount of power consumption.

In order to reduce power consumption further in the standby state, some flash memories are equipped with a deep-power-down mode (hereinafter referred to as DPD mode). In the DPD mode, a part of supplied power to the internal circuit is cut-off to reduce the off-leak current. For example, the flash memory enters to the DPD mode based on a DPD start command, and exits from the DPD mode based on a DPD released command. The DPD mode requires a certain time for the cut-off circuit to operate normally; on the contrary, the DPD mode has the advantage of reducing power consumption significantly.

FIG. 1 shows an example of the internal circuit whose power supply is cut-off by the conventional DPD mode. The internal circuit 10 comprises a PMOS transistor P1 and a plurality of registers. The PMOS transistor P1 is connected to a supply voltage VCC; and the registers are connected to the PMOS transistor P1 via a supply voltage node VCCREG. A DPDEN signal is applied to the gate of the PMOS transistor P1; the DPDEN signal is shifted to L level in the normal operation, and is shifted to H level in the DPD mode. In addition, the registers keep the information according to the operation of the flash memory, and keep the setting information read from the fuse cell.

FIG. 2 shows operation waveforms when in DPD mode. At time t1, the DPDEN signal is in L level, the transistor P1 is on, the voltage of the supply voltage node VCCREG is the supply voltage VCC, and each of the registers keep the data validly. At time t2, after the DPD start command is input, the DPDEN signal is shifted to H level, the PMOS transistor is off, the supply voltage VCC is cut off. Accordingly, the voltage of the supply voltage node VCCREG becomes floating, then, the potential of the supply voltage node VCCREG decreases gradually due to the off-leak current. At time t3, after the potential of the register decreases to the level which cannot keep the data anymore, the data kept in the register will be invalid, and the output data REGOUT of the registers also becomes invalid.

In this way, after the supply voltage provided to the internal circuit 10 is cut off in the DPD mode, the data in all registers are lost until the internal circuit 10 is exited from the DPD mode. In particular, in order to control the internal operation, the NAND flash memory comprises numerous of the registers. Once the data in the registers disappear, the setting information must be reloaded from the fuse cell to the register while exiting from the DPD mode, so it takes a lot of time.

The object of this invention is to solve the conventional problem described above, and to provide a semiconductor device that reduces the power consumption of the volatile circuit which the supply voltage applied to is cut off, and keeps the data in the volatile circuit in the same time.

Device to Solve the Problem

A semiconductor device according to this invention, comprises: a supply voltage; a volatile circuit comprising a first circuit and a second circuit, the first circuit for keeping data, and the second circuit for keeping checking data; a voltage-supply control circuit, connected between the supply voltage and the volatile circuit, controlling a supplied voltage from the supply voltage; and a determination circuit, determining whether the checking data kept in the second circuit is correct or not when the voltage-supply control circuit cuts off the supplied voltage; wherein the voltage-supply control circuit controls the supplied voltage of the supply voltage in response to the determination result of the determination circuit; and wherein a margin associated with an operating voltage of the second circuit is worse than that of the first circuit.

Effect of the Invention

According to this invention, it is possible to keep the data in the first circuit and reduce the power consumption in the same time by determining whether the checking data in the second circuit is correct or not, wherein the margin of the operating voltage of the second circuit is worse than that of the first circuit.

DETAILED DESCRIPTION

Next, embodiments of this invention will be described in detail with reference to the drawings. The semiconductor device is implemented in such as an NAND-type or an NOR-type flash memory, DRAM (dynamic random access memory), SRAM (static random access memory), logic, ASIC (application specific integrated circuit), DSP (digital signal processing), etc., and is not particularly limited.

Embodiments

Figure 1:
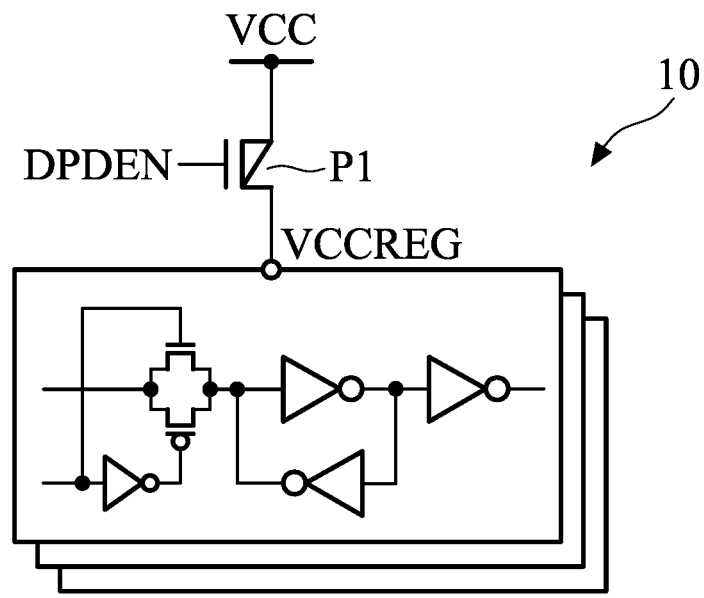
FIG. 1 shows an example of the internal circuit which the power supply is cut by the conventional DPD mode.
Figure 2:
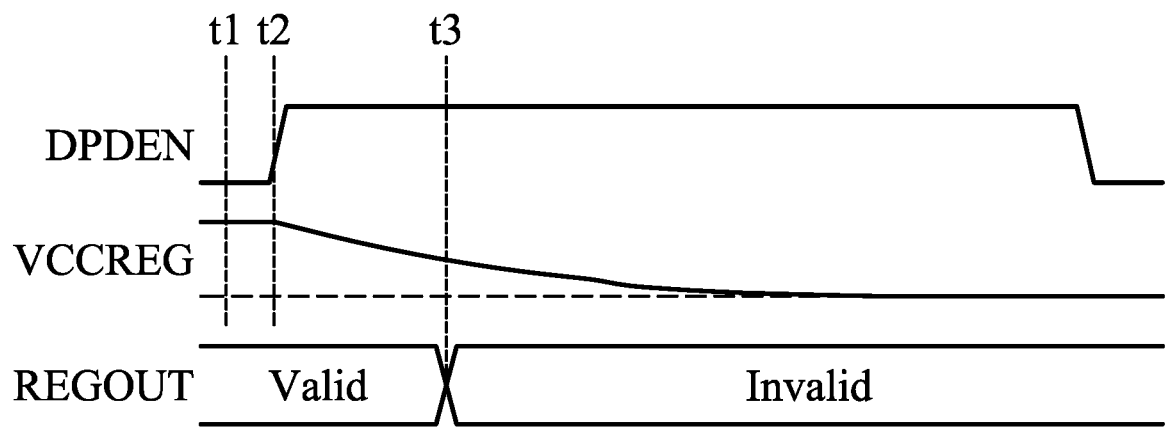
FIG. 2 shows an operation waveform of the internal circuit when in DPD mode.
Figure 3:
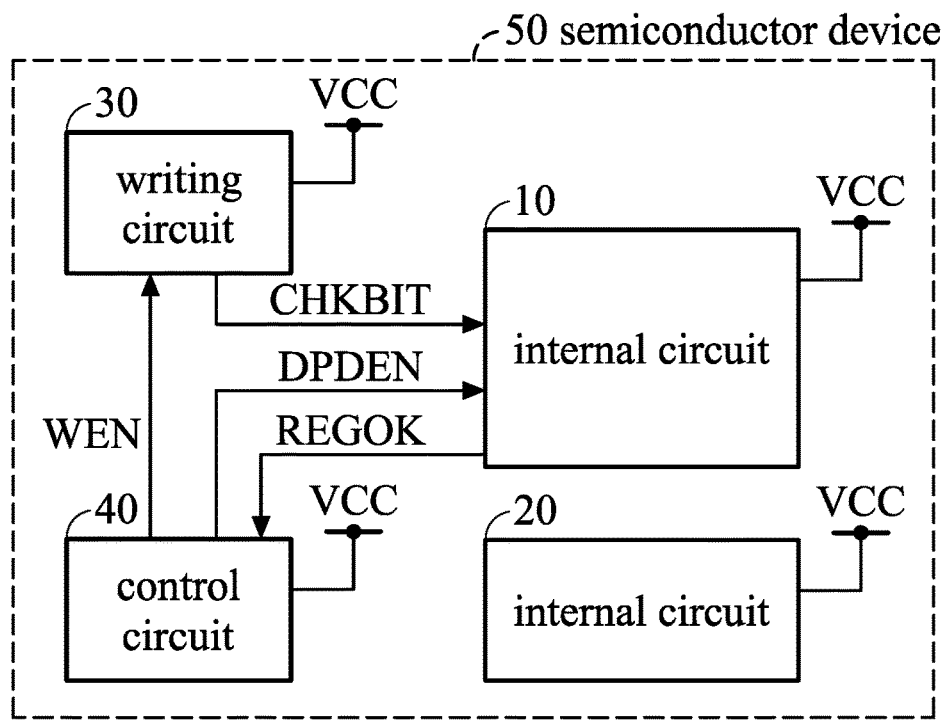
FIG. 3 shows a rough configuration of the semiconductor device according to the embodiment of this invention.

Next, embodiments of the invention will be described. FIG. 3 shows a rough configuration of the semiconductor device 50 according to the embodiments. For example, the semiconductor device 50 comprises internal circuits 10, 20, a writing circuit 30, and a control circuit 40. The control circuit 40, for example, can receive the command or the control signal from the outside, and control the operation of the internal circuits 10, 20 and the writing circuit 30 based on the received command or the received control signal. The semiconductor device 50 of this embodiment is equipped with the DPD mode, as a mode for further decreasing the power consumption in the standby state. The semiconductor device 50 can enter to the DPD mode in response to the command or the control signal from the outside, and can also exit from the DPD mode in response to the command or the control signal from the exterior.

After receiving the command or the control signal for entering the DPD mode, the control circuit 40 cuts off the supply voltage VCC provided to the internal circuit 10 by using the DPDEN signal for the selected internal circuit 10; after receiving the command or the control signal for releasing the DPD mode, the control circuit 40 provides the supply voltage VCC to the internal circuit 10 by using the DPDEN signal. Even when the circuit operation is stopped, as long as the supply voltage VCC is supplied, the circuit of the internal circuit 10 will generate the off-leak current, and the internal circuit 10 can keep the data. For example, the internal circuit 10 is like a circuit comprising a volatile register. The writing circuit 30 writes the check bit CHKBIT, to a part of the registers of the internal circuit 10 in response to the control signal WEN from the control circuit 40. Besides, FIG. 3 shows the example for interrupting the supply voltage VCC of one internal circuit 10 through the DPD mode, but this is one of the examples, it may also be designed to interrupt the supply voltage providing to a plurality of internal circuits. The internal circuit that the supply voltage is interrupted by the DPD mode can be selected appropriately based on the allowable power consumption in the standby state.

Figure 4:
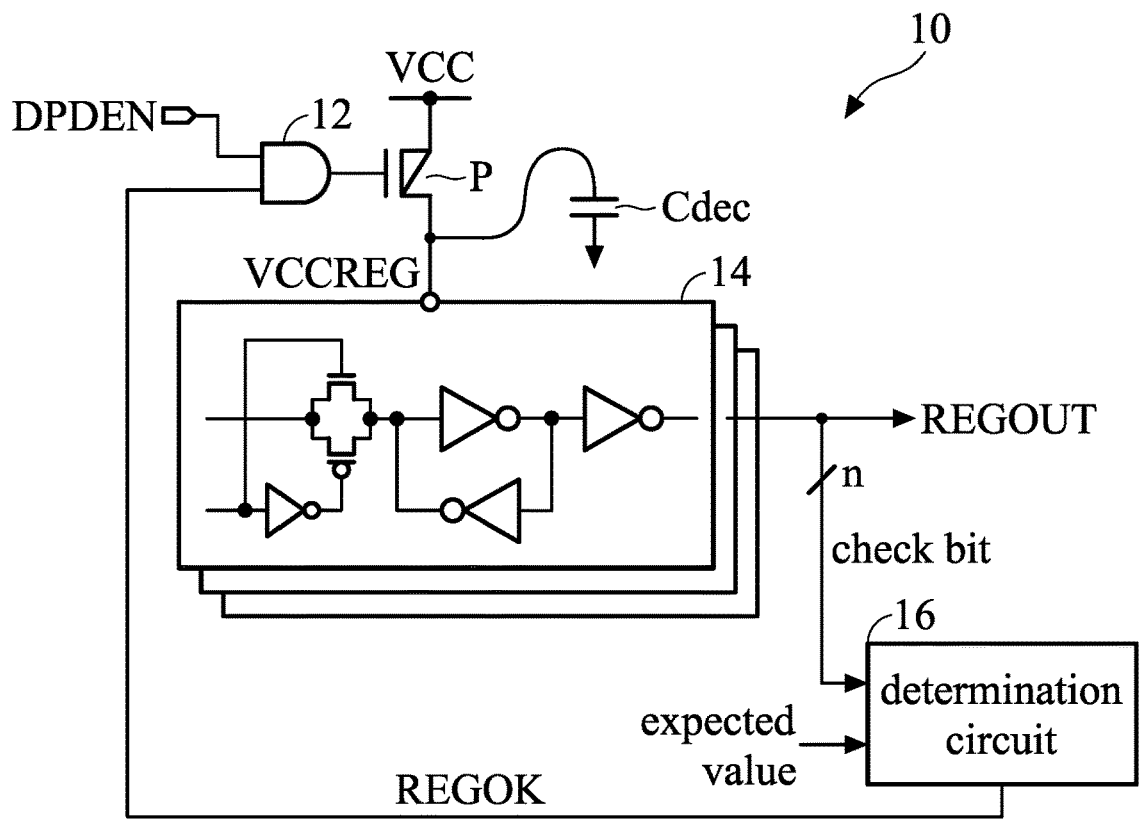
FIG. 4 shows an example of the internal circuit which the supply voltage is interrupted by the DPD mode according to the embodiment of this invention.

FIG. 4 shows an example of the internal circuit 10 of which the supply voltage is interrupted by the DPD mode according to the embodiment. As shown in this figure, the internal circuit 10 comprises: a PMOS transistor P, an AND gate 12, a plurality of registers 14, and a determination circuit 16. The PMOS transistor P is connected to the supply voltage VCC. The AND gate 12 is connected to the gate of the PMOS transistor P. The registers 14 is connected to the PMOS transistor P via a supply voltage node VCCREG. The determination circuit 16 determines whether the check bits kept in the registers 14 are correct or not.

The input on one side of the AND gate 12 is provided by the DPDEN signal of the control circuit 14; and the input on the other side of the AND gate 12 is provided by the REGOK signal indicating the determination result of the determination circuit 16. In the DPD mode, the AND gate 12 operates so that the PMOS transistor P is turned on when the check bit in a part of the registers is determined error.

The internal circuit 10 comprises the volatile registers 14 as described above. The configuration of the register is not particularly limited, for example, as shown in FIG. 4, comprises: a transmission gate for inputting the data, a latch for keeping the data input from the transmission gate, and an inverter for outputting the data kept in the latch. The registers 14 comprise general registers and checking registers, the general register is used to keep the data in the DPD mode, and the checking register is used to keep the check bit, for preventing the data kept in the general register from disappearing. The preferred checking register comprises a plurality of registers for keeping the n-bit data, the checking register keeps the n-bit check bit CHKBIT wrote from the writing circuit 30.

It should be noted here is that the margin of the operation voltage of the checking register, is worse (lower) than the margin of the operation voltage of the general register. In other words, the minimum value of the operating voltage of the checking register that can keeps the data validly, is higher than the minimum value of the operating voltage of the general register. When the supply voltage VCC starts to decrease, the data kept in the checking register is destroyed prior to the data kept in the general register. For example, the data kept in the latch in H level becomes L level.

As a method for deteriorating the margin of the operating voltage of the checking register, if both the registers are constructed by the transistors in the same size, then it is designed such that the operating voltage providing to the checking register, is lower than the operating voltage providing to the general register in the DPD mode. For example, it can be designed to add a capacitor Cdec to the supply voltage node VCCREG which is connected to the general register, so that the supply voltage node VCCREG becomes floating in the DPD mode, and the floating capacitance of the supply voltage node VCCREG which is connected to the general register, is larger than the floating capacitance of which is connected to the checking register. As a result, the elapsed time due to the off-leak current of the register becomes longer in the general resister, and the data in the checking register is destroyed first. As another method, such as the transistor or the wire constructing the checking register, can be designed to be different from that of the general register (for example, changing the RC constant), such that the floating capacitance of the checking register is smaller than the floating capacitance of the general register.

The determination circuit 16 compares the n-bit check bit output from the checking register, to an expected value prepared in advance, to determine whether the check bit and the expected value match or not. When the check bit matches the expected value, the determination circuit 16 outputs a signal REGOK (for example, H level) indicating the check bit is correct. When the check bit doesn't match the expected value, the determination circuit 16 outputs a signal REGOK (for example, L level) indicating the check bit is incorrect.

Figure 5:
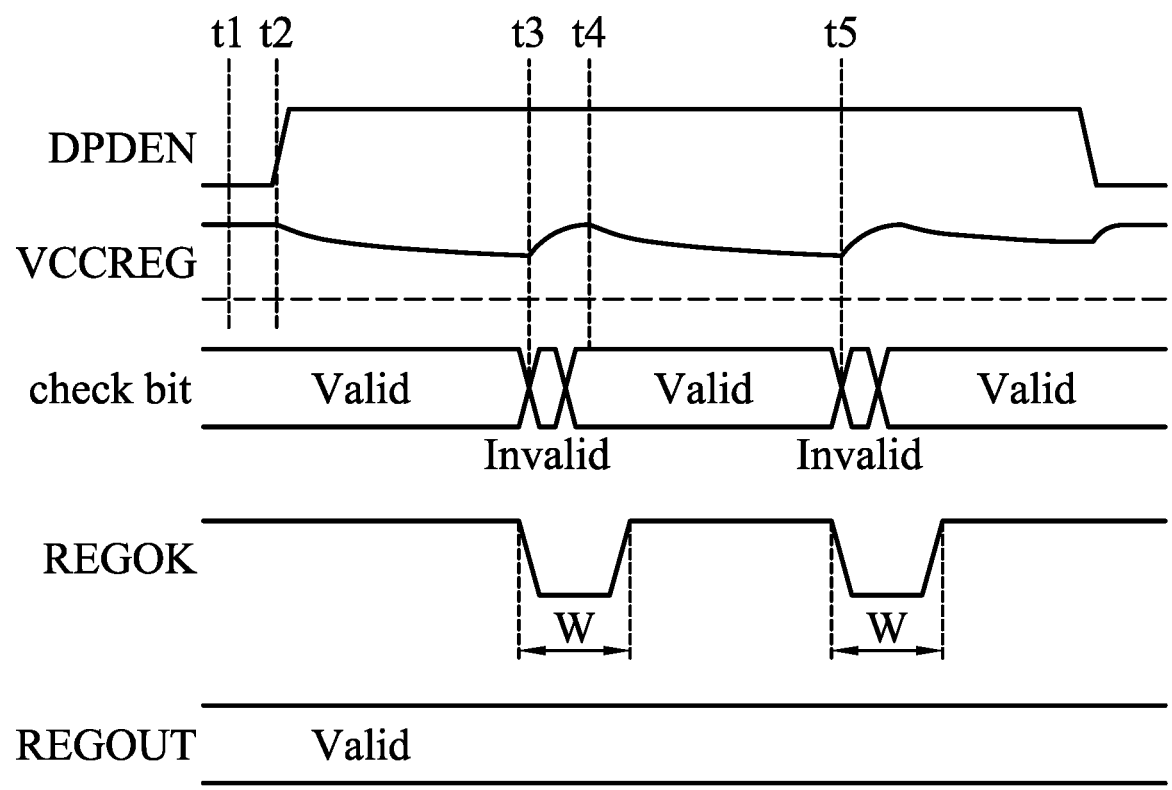
FIG. 5 shows an operation waveform of the internal circuit when in DPD mode according to the embodiment.

FIG. 5 shows an operation waveform of the internal circuit when in DPD mode. At time t1, the semiconductor device is performing normal operation, the DPDEN signal output from the control circuit 40 is L level. Therefore, the PMOS transistor P is turned on, the supply voltage VCC is provided to the registers 14. Besides, the control circuit 40 writes the n-bit check bit to the checking register via the writing circuit 30. For example, the control circuit 40 writes "FFh" or "AAh" to the 2-byte checking register. In the normal operation, because the supply voltage VCC is provided to the registers 14, the data kept in the registers are valid. Therefore, the comparing result of comparing the check bit to the expected value by the determination circuit 16 is matched, the signal REGOK is in H level. In addition, the expected value input to the determination circuit 16, is the known check bit written by the writing circuit 30, for example, the control circuit 40 can provide the expected value to the determination circuit 16.

At time t2, the control circuit 40 receives the command to enter the DPD mode from the user, the DPDEN signal responds to this and shifts to the H level, and the output of the AND gate 12 responds to this and shifts to the H level. In this way, the PMOS transistor P is turned off, the supply voltage VCC provided to the internal circuit 10 is cut off, the voltage of the supply voltage node VCCREG becomes floating. The potential at the supply voltage node VCCREG decreases gradually due to the off-leak current, at time t3, the checking register becomes unable to keep the check bit anymore. For example, the output in H level becomes L level. As a result, the check bit doesn't match the expected value, and the determination circuit 16 outputs the signal REGOK in L level. The output of the AND gate 12 responds to the signal REGOK and shifts to the L level, the PMOS transistor P is turned on, and the supply voltage VCC is provided to the registers 14. It should be noted here is that when the data in the checking register is damaged, because the operation margin due to the supply voltage VCC variation of the other register, is bigger than that of the checking register, therefore the other register can keep the data correctly. Therefore, the data of the output REGOUT from the other register is valid.

The determination circuit 16 sets the pulse width W of the signal REGOK in L level, so that the voltage of the supply voltage node VCCREG can be charged to VCC level in sufficient time. In addition, the signal REGOK is also provided to the control circuit 40, in a period of the pulse width W, the control circuit 40 rewrites the check bit to the checking register via the writing circuit 30.

In a period of the pulse width W, the level of the supply voltage of the registers 14 returns to VCC level, and the check bit has been rewritten to the checking register. At time t4, the check bit matches the expected value again, and the signal REGOK of the determination circuit 16 shifts to H level. In this way, the output of the AND gate 12 shifts to H level, the PMOS transistor is turned off, and the supply voltage provided to the registers 14 is cut off. The voltage of the supply voltage node VCCREG becomes floating again, the potential of the supply voltage node VCCREG decreases gradually due to the off-leak current leakage. At time t5, if the check bit doesn't match the expected value, then in a period of the pulse width W, the signal REGOK shifts to L level, in that period, the PMOS transistor is turned on, the voltage of the supply voltage node VCCREG is starting to be charged, and the check bit is written to the checking register again. After that, the same operation will be repeated until the command to release the DPD mode is input.

According to the embodiment like this, it is designed such that monitoring whether the check bit kept in the checking register of the internal circuit 10, of which the supply voltage VCC, is cut is correct or not. When the check bit is determined to be incorrect, the supply voltage charges the internal circuit 10, therefore, the other registers in the internal circuit 10 can keep the correct data, on the other hand, it can reduce the current consumption in the DPD mode.

In the embodiment described above, the writing circuit 30 and the control circuit 40 are configured separately, but the configuration is not limited to this, it may also to be designed such that the control circuit 40 performs the input of the check bit to the checking register. In addition, in the embodiment described above, the example of generating the signal REGOK with the pulse width W by the determination circuit 16 is shown, but the configuration is not limited to this, for example, it is also possible to prepare a pulse generator different from the determination circuit 16, so that the pulse generator responds to the determination result of the determination circuit 16 and provides the pulse signal with the pulse width W to the AND gate 12. In addition, in the embodiment described above, the example of the internal circuit 10 comprising the volatile register is shown, but the configuration is not limited to this, it is also possible to apply the invention to the internal circuit 10 comprising the volatile memory such as the SRAM or the latch circuit.

Figure 6:
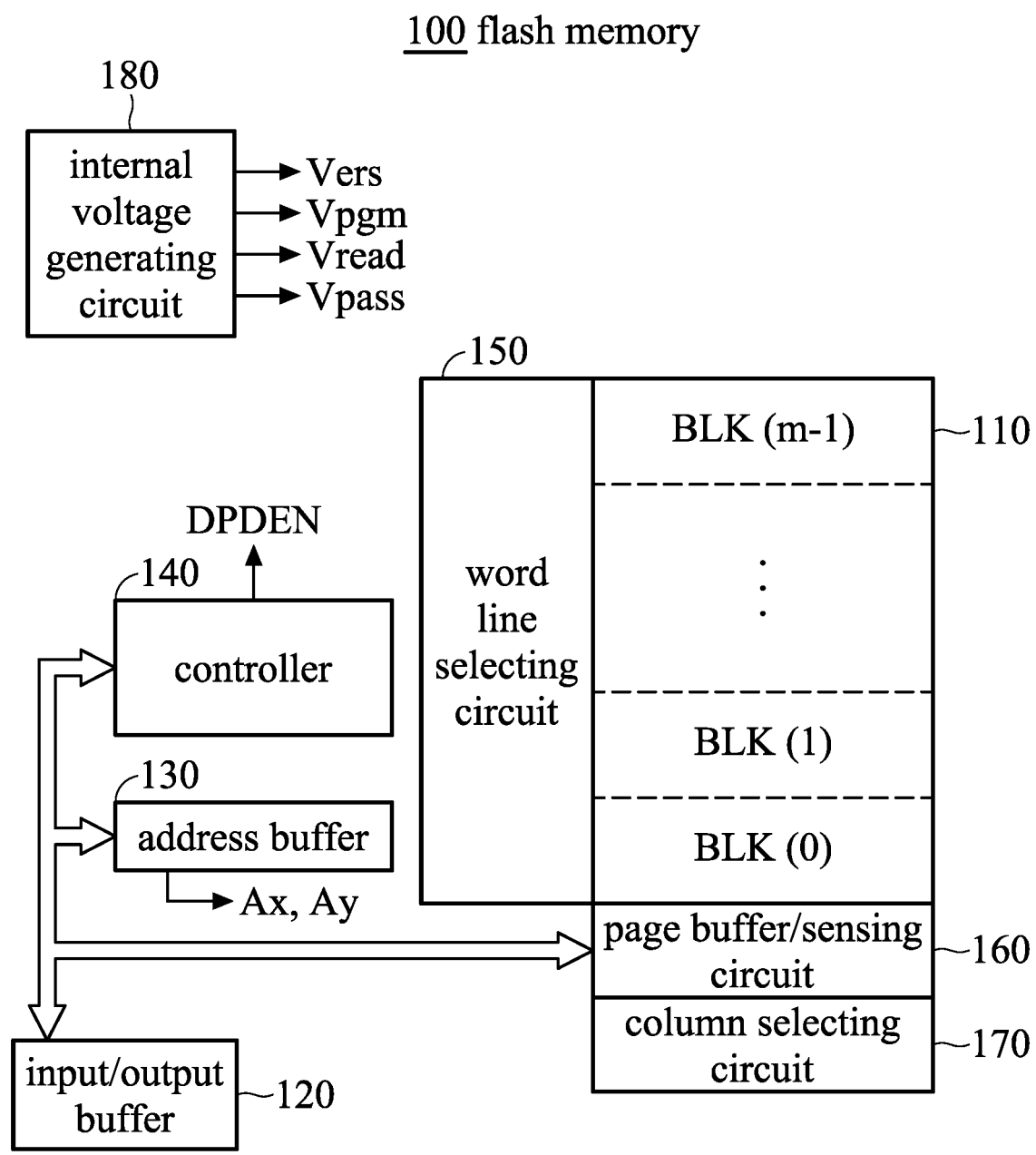
FIG. 6 shows an example of the memory equipped with the DPD mode according to the embodiment of this invention.

Next, FIG. 6 shows an example of the flash memory equipped with the DPD mode. The flash memory 100 comprises: a memory cell array 110, an input/output buffer 120, an address register 130, a controller 140, a word line selecting circuit 150, a page buffer/sensing circuit 160, a column selecting circuit 170, and an internal voltage generating circuit 180. The memory cell array 110 has a plurality of memory cells arranged in a matrix. The input/output buffer 120 is connected to an external input/output terminal I/O. The address register 130 receives address data from the input/output buffer 120. The controller 140 receives command data from the input/output buffer 120 and controls every part of the circuits. The word line selecting circuit 150 receives row address information Ax from the address register 130. The word line selecting circuit 150 decodes the row address information Ax and selects the block and the word line based on the decoding result. The page buffer/sensing circuit 160 keeps the data read from the page selected by the word line selecting circuit 150. The page buffer/sensing circuit 160 keeps the input data which is supposed to be programmed to the selected page. The column selecting circuit 170 receives column address information Ay from the address register 130. The column selecting circuit 170 decodes the column address information Ay and selects the data of the column address in the page buffer/sensing circuit 160 based on the decoding result. The internal voltage generating circuit 180 generates every kind of essential voltage: for reading, programming, erasing data, etc. (writing voltage Vpgm, passing voltage Vpass, reading pass voltage Vread, erasing voltage Vers, etc.).

After receiving a command to start the DPD mode from outside, the controller 140 provides the DPDEN signal which is asserted to H level to the selected internal circuit. In this way, the supply voltage VCC provided to the internal circuit is cut. The internal circuit comprises the volatile memory such as the register or the SRAM, and the determination circuit 16, etc. A part of the volatile memory is used as the check memory for memorizing the check bit, just the same as the above embodiment. In the DPD mode, if the check bit kept in the check memory doesn't match the expected value, the supply voltage VCC provided to the internal will restart to charge; while if the check bit matches the expected value, the supply voltage VCC provided to the internal will be interrupted. This kind of charging/interrupting control of the supply voltage VCC will be performed until the command to release the DPD mode is input.

According to this embodiment, in the DPD mode of the flash memory, it is possible to reduce the power consumption, and prevent the data kept in the volatile memory from disappearing.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a supply voltage;
   a volatile circuit, comprising a first circuit configured to keep data and a second circuit configured to keep checking data;
   a voltage-supply control circuit, connected between the supply voltage and control circuit, and controlling a supplied voltage from the supply voltage; and
   a determination circuit, determining whether the checking data kept in the second circuit is correct or not when the voltage-supply control circuit interrupts the supplied voltage;
   wherein the voltage-supply control circuit controls the supplied voltage of the supply voltage in response to the determination result of the determination circuit; and
   wherein a margin according to an operating voltage of the second circuit is worse than that of the first circuit.

2. The semiconductor device as claimed in claim 1, wherein when the supplied voltage from the supply voltage is interrupted, the data of the second circuit is destroyed prior to that of the first circuit.

3. The semiconductor device as claimed in claim 1, wherein when the supplied voltage from the supply voltage is interrupted, a node provided by the supplied voltage from the supply voltage becomes floating, a potential at the node gradually decreases, and the data kept in the second circuit is destroyed prior to that in the first circuit.

4. The semiconductor device as claimed in claim 1, wherein the voltage-supply control circuit interrupts the supplied voltage from the supply voltage in response to a signal indicating a power-down mode, and restarts the supplied voltage from the supply voltage by determining the checking data being incorrect through the determination circuit.

5. The semiconductor device as claimed in claim 1, further comprising:
   a writing circuit, writing correct checking data to the second circuit when the checking data is determined to be incorrect.

6. The semiconductor device as claimed in claim 5, wherein the determination circuit comprises a circuit that generates a pulse signal having a predetermined pulse amplitude in response to determining that the checking data is incorrect; and
   wherein the voltage-supply control circuit charges the volatile circuit, and writes the correct checking data to the second circuit during a period determined by the predetermined pulse amplitude.

7. The semiconductor device as claimed in claim 1, wherein the determination circuit determines whether the checking data exists or not by comparing the checking data output by the second circuit to an expected value.

8. The semiconductor device as claimed in claim 5, wherein the writing circuit writes the expected value to the second circuit.

9. The semiconductor device as claimed in claim 1, wherein the first circuit and the second circuit comprise a plurality of transistors; and
   wherein the first circuit keeps operation information loaded from a volatile memory during a power-up operation.

10. The semiconductor device as claimed in claim 1, wherein the voltage-supply control circuit comprises:
    a cut-off transistor, connected between the supply voltage and the volatile circuit; and
    a control gate, controlling the cut-off transistor based on a signal indicating a power-down mode and a signal indicating the determination result of the determination circuit.

* * * * *